(12) United States Patent
Thewissen et al.

(10) Patent No.: US 10,056,485 B2
(45) Date of Patent: Aug. 21, 2018

(54) SEMICONDUCTOR DEVICES WITH GATE-CONTROLLED ENERGY FILTERING

(71) Applicants: IMEC VZW, Leuven (BE); Universiteit Antwerpen, Antwerpen (BE)

(72) Inventors: Maarten Thewissen, Leuven (BE); Wim Magnus, Onze-Lieve-Vrouw-Waver (BE); Bart Soree, Begijnendijk (BE)

(73) Assignees: IMEC VZW, Leuven (BE); UNIVERSITEIT ANTWERPEN, Antwerpen (BE)

( * ) Notice: Subject to any disclaimer, the term of this patent is extended or adjusted under 35 U.S.C. 154(b) by 92 days.

(21) Appl. No.: 15/393,905

(22) Filed: Dec. 29, 2016

(65) Prior Publication Data

US 2018/0190818 A1 Jul. 5, 2018

(51) Int. Cl.
*H01L 21/00* (2006.01)
*H01L 29/78* (2006.01)
(Continued)

(52) U.S. Cl.
CPC ...... *H01L 29/7831* (2013.01); *H01L 29/0676* (2013.01); *H01L 29/1037* (2013.01);
(Continued)

(58) Field of Classification Search
CPC ........... H01L 29/42376; H01L 29/2003; H01L 29/0623; H01L 31/035236
See application file for complete search history.

(56) References Cited

U.S. PATENT DOCUMENTS

2004/0227165 A1* 11/2004 Wang ............... H01L 29/768
257/222
2009/0108743 A1* 4/2009 Kobayashi ......... H01L 51/5281
313/504
(Continued)

OTHER PUBLICATIONS

Seabaugh, Alan C. et al., "Low-Voltage Tunnel Transistors for Beyond Cmos Logic", Proceedings of the IEEE, vol. 98, No. 12, Dec. 2010, pp. 2095-2110.
(Continued)

*Primary Examiner* — Nicholas Tobergte
(74) *Attorney, Agent, or Firm* — McDonnell Boehnen Hulbert & Berghoff LLP

(57) ABSTRACT

The present disclosure relates to semiconductor devices with gate-controlled energy filtering. One example embodiment includes a semiconductor device. The semiconductor device includes a first electrode, a second electrode, and a channel therebetween. The semiconductor device also includes a first interference structure located in the channel. Further, the semiconductor device includes a first gate for controlling a voltage over the first interference structure. The first interference structure is formed to induce a local mini-band structure that can be shifted by the voltage controlled by the first gate, such that the first local mini-band structure is: (1) aligned with a band structure in the semiconductor device to turn the semiconductor device on; and (2) misaligned with the band structure in the semiconductor device to turn the semiconductor device off.

20 Claims, 12 Drawing Sheets

(51) Int. Cl.
H01L 29/10 (2006.01)
H01L 29/417 (2006.01)
H01L 29/15 (2006.01)
H01L 29/06 (2006.01)
H03K 17/16 (2006.01)
H01L 29/423 (2006.01)
H01L 29/20 (2006.01)
H01L 31/0352 (2006.01)

(52) U.S. Cl.
CPC ...... *H01L 29/155* (2013.01); *H01L 29/41758* (2013.01); *H01L 29/42376* (2013.01); *H03K 17/162* (2013.01); *H01L 29/0623* (2013.01); *H01L 29/2003* (2013.01); *H01L 31/035236* (2013.01)

(56) References Cited

U.S. PATENT DOCUMENTS

| | | | |
|---|---|---|---|
| 2009/0209067 A1* | 8/2009 | Ponomarev | H01L 29/1054 438/151 |
| 2011/0148547 A1* | 6/2011 | Zhang | H03H 9/02118 333/187 |
| 2017/0179263 A1* | 6/2017 | Pourtois | H01L 29/66977 |

OTHER PUBLICATIONS

Gnani, E. et al., "Performance Limits of Superlattice-Based Steep-Slope Nanowire FETs", In Electron Devices Meeting (IEDM), 2011 IEEE International, pp. 5.11-5.1.4.

Gnani, Elena et al., "Steep-Slope Devices: Prospects and Challenges", Journal of Nano Research, ISSN: 1661-9897, vol. 39, Dec. 18, 2016, pp. 3-16.

Maiorano, P. et al., "Design and Optimization of Impurity- and Electrostatically-Doped Superlattice FETs to Meet all be ITRS Power Targets at VDD = 0.4 V", Solid-State Electronics, vol. 101, 2014, pp. 70-78.

Perevalov, T. V. et al., "Electronic Structure of a-Al2O3: Ab Indio Simulations and Comparison With Experiment", JETP Letters, vol. 85, No. 3.2007, pp. 165-168.

Nguyen, N.V. et al., "Band Offsets of Atomic-Layer-Deposited Al2O3 on GaAs and the Effects of Surface Treatment", Applied Physics Letters, vol. 93, 082105, 2008, 3 pages.

Lent, Craig S. et al., "The Quantum Transmitting Boundary Method", J. Appl. Phys., vol. 67, No. 10, May 15, 1990, pp. 6353-6359.

Logg, Anders et al., "Automated Solution of Differential Equations by the Finite Element Method", Lecture Notes in Computational Science and Engineering, The FEniCS Book, vol. 84, Springer Berlin Heidelberg, 2012, 723 pages.

Kronig, R. de L et al., "Quantum Mechanics of Electrons in Crystal Lattices", Proceeding of the Royal Society of London A: Mathematical, Physical and Engineering Sciences, vol. 130, 1931, pp. 499-513.

Liboff, Richard L., "Introductory Quantum Mechanics", Addison-Wesley Publishing Company, 1980, 660 pages.

Thewissen, Maarten et al., "The Miniband Alignment Field-Effect Transistor: A Superlattice-Based Steep-Slope Nanowire FET"; arXiv: 1609.09372v2; published to arXiv Sep. 30, 2016, pp. 1-9.

Thewissen, M. et al., "The Miniband Alignment Field-Effect Transistor: A Superlattice-Based Steep-Slope Nanowire FET", arXiv: 1609.09372v2; published to arXiv Sep. 30, 2016, pp. 1-9.

* cited by examiner

SEMICONDUCTOR DEVICES WITH GATE-CONTROLLED ENERGY FILTERING

FIELD OF THE DISCLOSURE

The disclosure relates to the field of semiconductor devices. More specifically it relates to the field of gate controlled semiconductor devices.

BACKGROUND

After five decades of Moore's law the bottleneck hampering further downscaling of chip sizes is no longer process technology, but rather power consumption.

Leakage currents in present-day MOSFETs define the limit for the power-performance trade-off, i.e. limit clock rates for a given available power. A major component of these leakage currents is the subthreshold current, which sets a physical limit to how fast a transistor can be turned off: at most 1 order of magnitude current for a 60 mV change in gate bias.

To reduce dynamic power the chip's supply voltage may be scaled down as well, thereby causing an exponential increase in leakage current if the field-effect transistor's (FET) threshold voltage is to be scaled along. The resulting trade-off between power consumption and performance effectively follows from the impossibility to turn off transistors abruptly, as represented by a subthreshold slope of at least 60 mV per decade of current.

Proposed device architectures try to alleviate this limit of the subthreshold slope, often employing features of quantum mechanics to do so. However, there is still room for improvement in the design of these semiconductor devices.

SUMMARY

Embodiments of the present disclosure provide semiconductor devices.

The disclosure may additionally provide a method.

In a first aspect embodiments of the present disclosure relate to a semiconductor device. The semiconductor device comprises a first electrode, a second electrode, a channel in between the first electrode and the second electrode. The semiconductor device moreover comprises at least a first interference structure located in the channel such that when a current is flowing from the second electrode to the first electrode it passes through the interference structure, and a first gate for controlling a voltage over the first interference structure.

The first interference structure is formed to induce a first local mini-band structure, which can be shifted by the voltage on the first gate such that the first local mini-band structure is aligned with another band structure in the semiconductor device to turn the semiconductor device on and misaligned to turn it off.

In some embodiments of the present disclosure, the first local mini-band structure of the first interference structure can be controlled by the first gate. In some embodiments of the present disclosure, the first local mini-band structure can be shifted by applying a voltage on the first gate and it is thereby possible to turn the semiconductor device on or off. This may for example be done by aligning or misaligning the first local mini-band structure with the conduction band of the semiconductor device. In that case the conduction band corresponds with the other band structure in the semiconductor device.

In embodiments of the present disclosure the semiconductor device comprises at least one further interference structure located in series with the first interference structure, such that when a current is flowing from the second electrode to the first electrode it passes through the at least two interference structures. The at least one further interference structure is formed to induce a further local mini-band structure, and the first local mini-band structure can be shifted by the voltage on the first gate such that the first and further mini-band structures are aligned to turn on the semiconductor device and misaligned to turn it off. In that case the further mini-band structure corresponds with the other band structure in the semiconductor device.

In some embodiments of the present disclosure, the first local mini-band structure can be aligned or misaligned with the further local mini-band structure, for respectively turning on or off the semiconductor device. By introducing these interference structures the leakage current of the semiconductor device is reduced, compared to alternative semiconductor devices where the band structure of the material is controlled to switch on or off the semiconductor device. In some embodiments of the present disclosure, turning off the device by misalignment of mini-bands can be induced by increasing the controlling gate bias. As a result for changing gate bias, the electrons responsible for most of the current will not be filtered out immediately. The ON-current remains its value over a larger bias range, which allows for a steeper subthreshold slope. In embodiments of the present disclosure the mini-bandgaps filter out the electrons that would otherwise form the subthreshold current, thereby steepening the subthreshold slope.

Creating a further (e.g. second) local mini-band structure which can be aligned or misaligned with a first local mini-band structure, may provide for the following:

no band-to-band tunnelling is required to turn on the device, as electrons remain in the same band. This may prevent band-to-band tunnelling from limiting the on-current of the device. Hence, some embodiments of the present disclosure permit a higher on-current to be achieved than would be the case when band-to-band tunnelling is required for the on-current; and no steep doping profiles are needed.

Some embodiments of the present disclosure are less susceptible to surface scattering than TFETs, because the electron wave functions do not pile up near the oxide interface, but are spread out over the device. Also, in embodiments of the present disclosure, no impurity dopants are present in the active device regions that can destroy coherence of the wave functions.

In embodiments of the present disclosure the semiconductor device comprises two interference structures.

In embodiments of the present disclosure the semiconductor device comprises at least one further gate for controlling the voltage over at least one of the at least one further interference structure for shifting the further local mini-band structure.

In some embodiments of the present disclosure, the further (e.g. second) local mini-band structure induced by the further (e.g. second) interference structure can be controlled by a further gate. The further gate may be contacted and held to a fixed potential (positive bias, negative bias, or connected to ground, depending on the corresponding electrostatic doping level).

In some embodiments of the present disclosure, the further (e.g. second) local mini-band structure can be aligned or misaligned with respect to another local mini-band structure by controlling the further gate voltage. It may for example be possible to align or misalign the first local mini-band structure, induced by the first interference structure, with the further local mini-band structure by controlling the first and further gate voltages. By varying the voltage over the further gate the resonance peaks in the interference structures will shift to other values.

In embodiments of the present disclosure the further interference structure is doped.

In embodiments of the present disclosure the energy levels of the mini-band structure induced by the further (e.g. second) interference structure may be controlled by a further gate. However, as an alternative, they also may be controlled by a dopant. By controlling the voltage on the further gate or the doping level in the further interference structure, the number of electrons in the further interference structure can be controlled. By controlling the energy levels of the further (e.g. second) mini-band structure, the subthreshold slope of the semiconductor device can be influenced.

In embodiments of the present disclosure the doping level of the first electrode is selected such that a Fermi-level of the first electrode and the second electrode lies within or just below a lowest mini-band of the mini-band structure induced by the interference structure closest to the first electrode.

In embodiments of the present disclosure the Fermi-level may be optimized for performance (speed) or low-power. This optimization depends on the device configuration. In embodiments of the present disclosure the values for doping may be selected such that the Fermi-level of the first electrode (the electrode that injects the charge carriers) coincides with the bottom of the lowest mini-band, plus minus 0.05 eV. In embodiments of the present disclosure the first electrode is the electrode that injects the charge carriers (i.e. a source) and the second electrode is a drain. In these embodiments the Fermi-level in the drain electrode lies $V_d$ electron volts lower than the Fermi level in the source electrode.

In some embodiments of the present disclosure, a trade-off is achieved between high doping levels to achieve a substantial on-current, and low occupation of the higher mini-bands. These higher mini-bands may prevent the device from turning off properly. Therefore a trade-off may still be used.

In embodiments of the present disclosure the at least one interference structure is a super-lattice structure comprising stacks of alternating super-lattice planes, wherein the planes are oriented such that, when a current is flowing from the first electrode to the second electrode, the current direction is substantially orthogonal to the super-lattice planes.

In embodiments of the present disclosure the different super-lattice planes may be realized by layers of different materials; they may be realized by dopant atoms at regularly spaced distances; they may be realized by changing the cross-section of the channel.

In embodiments of the present disclosure the semiconductor device is an elongated nanostructure.

An elongated nanostructure may for example be a nanowire or a nanorod. In embodiments of the present disclosure the first and/or further gate is a gate all around the elongated nanostructure.

In embodiments of the present disclosure the at least one interference structure is made by locally varying a diameter of the elongated nanostructure.

In a second aspect embodiments of the present disclosure relate to a transistor comprising a semiconductor device in accordance with embodiments of the present disclosure. In such a transistor the first electrode is a source and the second electrode is a drain.

In a third aspect embodiments of the present disclosure relate to a semiconductor circuit comprising a semiconductor device or a transistor in accordance with embodiments of the present disclosure.

In a fourth aspect embodiments of the present disclosure relate to a method for controlling a semiconductor device in accordance with embodiments of the present disclosure. The method comprises controlling the voltage of the first gate thereby shifting the first local mini-band structure such that it is aligned with another band structure in the semiconductor device to switch the semiconductor device on, or misaligned to switch the semiconductor device off.

In some embodiments of the present disclosure, where the mini-bands of the interference structures (e.g. super-lattice regions) align or where the first local mini-band structure is aligned with the conduction band of the semiconductor device, passbands are formed and current can pass. Misalignment between the first and further mini-band structure can be realized by changing the first and/or further gate voltage, or misalignment between the first local mini-band structure and the conduction band can be realized by changing the voltage on the first gate. In some embodiments of the present disclosure, as soon as misalignment of the lowest mini-bands of the first and further local mini-band structure is complete, or misalignment between the lowest mini-band of the first local mini-band structure and the conduction band is complete, the lowest passband ceases to exist and the current drops sharply. This may result in a subthreshold slope of less than 10 mV/decade, or even lower.

In embodiments of the present disclosure the method comprises controlling the voltage of the first gate, and the voltage of the further gate, such that the local mini-band structures are aligned for switching on the semiconductor device and such that some of the mini-band structures are misaligned for switching off the semiconductor device.

In embodiments of the present disclosure the method comprises shifting the further mini-band structure by a fixed offset by applying a fixed offset voltage on the further gate.

In some embodiments of the present disclosure, by controlling the voltage on the further (e.g. second) gate, the purpose of electrostatic doping can be fulfilled by the further gate as an alternative to impurity doping. This allows a more flexible control of the resonance energy levels, i.e. those energy levels contributing to the transmission of electrons, of the further mini-band structure.

In a fifth aspect embodiments of the present disclosure relate to the use of a semiconductor device wherein the gates are used as logical inputs of the semiconductor device.

In some embodiments of the present disclosure, a semiconductor device according to embodiments of the present disclosure can be used as a logic gate. In some embodiments, such a logic gate can be made more compact than would be the case when using state of the art MOSFETs.

Semiconductor devices according to the present disclosure may comprise two or more gates, each controlling the voltage of an interference structure thereby controlling the corresponding mini-band structure. In that case the semiconductor device may serve as a logical gate: when all mini-bands are aligned, current can flow and the gate returns a logic 1. When some mini-bands are misaligned, current cannot flow and the gate returns a logic 0.

In embodiments of the present disclosure the semiconductor device comprises a first and second interference structure which can respectively form a first and second mini-band structure. These are respectively controlled by a first and a second gate using a first and second input voltage. In these embodiments the first and second mini-band structure may be both aligned when the first input voltage and the second input voltage are the same, and they may be misaligned when the first input voltage and the second input voltage are different. When these first and second gates are used as logical inputs, the semiconductor device is a logical gate.

This allows for example to create an AND gate, wherein a 0-1 or a 1-0 or a 0-0 combination on respectively the first and further gate results in a 0 output.

This allows for example to create a gate wherein misaligned mini-band structures (0-1 or 1-0) result in output 0, and wherein aligned mini-band structures (1-1 or 0-0) result in output 1. Gates may be dimensioned with different barrier and well widths in both super-lattices to obtain different types of gates.

Particular aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
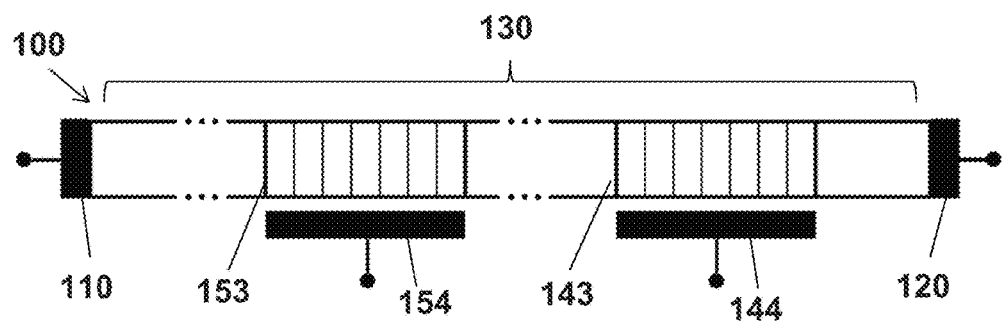
FIG. 1 shows a schematic drawing of a semiconductor device, according to example embodiments.

Any reference signs in the claims shall not be construed as limiting the scope. In the different drawings, the same reference signs refer to the same or analogous elements.

DETAILED DESCRIPTION

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to a channel, reference is made to the region between the first and the second electrode. The at least one interference structure is located in this region.

Where in embodiments of the present disclosure reference is made to a mini-band structure, reference is made to a band structure of allowed energy bands (mini-bands) and forbidden bandgaps that result from a periodic structure on top of the crystal periodicity. Such a periodic structure can for example be a super-lattice.

Where in embodiments of the present disclosure reference is made to shifting of the local mini-band structure, reference is made to increasing or decreasing the mini-band energies by changing the bias of the gate located nearby the interference structure which induces this mini-band structure.

In a first aspect embodiments of the present disclosure relate to a semiconductor device 100 which can be switched on or off by shifting a first local mini-band structure 210. The semiconductor device comprises a first electrode 110, a second electrode 120, and a channel 130 in between the first electrode and the second electrode.

The semiconductor device 100 moreover comprises a first interference structure 143 (a periodic potential such as a super-lattice) located in the channel 130. It is positioned such that when a current is flowing from the second electrode 120 to the first electrode 110 it passes through the interference structure, and a first gate 144 for controlling a voltage over the first interference structure. This first interference structure 143 gives rise to the first local mini-band structure 210.

The semiconductor device 100 moreover comprises a first gate 144 for controlling a voltage over the first interference structure 143. Therefore the first interference structure is positioned near the first gate such that the mini-band energies of the first local mini-band structure 210 can be decreased or increased by changing the bias of the first gate 144.

In embodiments of the present disclosure the first local mini-band structure can be shifted by applying a voltage on the first gate. It can be shifted such that the first local mini-band structure 210 is aligned with another band structure in the semiconductor device 100 to turn the semiconductor device on and misaligned to turn it off.

When the first interference structure (periodic potential) is included in the device, it locally leads to the creation of the first local mini-band structure (mini-bands and bandgaps) on top of the existing band structure. The mini-bandgaps then filter out the electrons that would otherwise constitute the subthreshold current, thereby steepening the subthreshold slope.

Such an interference structure 143 refers to anything that can cause interference effects such as for example a super-lattice, where a stack of alternating semiconductor materials leads to a periodic conduction band offset.

Other examples of interference structures 143 include a varying diameter of a nanowire, a periodic functionalization of for example graphene using different molecules, dopant atoms introduced at a regularly spaced distance.

In embodiments of the present disclosure the semiconductor device 100 comprises at least one further interference structure 153. This interference structure is located in series with the first interference structure 143, such that when a current is flowing from the second electrode 120 to the first electrode 110 it passes through the at least two interference structures.

The at least one further interference structure 153 is formed to induce a further local mini-band structure 220. In embodiments of the present disclosure the first local mini-band structure 210 can be shifted by the voltage on the first gate 144 such that the local mini-band structures of the first and further interference structures are aligned to turn on the semiconductor device and misaligned to turn it off. Thus the local mini-band structures act as an energy filter.

In some embodiments of the present disclosure, the subthreshold current, coming from high-energy carriers that remain present according to Fermi-Dirac statistics, are prevented from being injected in the semiconductor device. This may allow for suppression of the subthreshold current.

Additionally, in some embodiments of the present disclosure, no band-to-band tunnelling (as in TFETs) is required to turn on the semiconductor device, as this band-to-band tunnelling limits the on-current. In embodiments of the present disclosure a part of the Fermi-tail will still be present and the OFF-current will be higher than for TFETs (but given the higher ON-current, a steeper subthreshold slope is still possible).

FIG. 1 shows a schematic drawing of a semiconductor device 100 in accordance with embodiments of the present disclosure. A channel 130 is present between a first electrode 110 and a second electrode 120. A first interference structure 143 and a further interference structure 154 are positioned in series in the channel 130. A first gate 144 is positioned next to the first interference structure 143 such that the first local mini-band structure 210, induced by the first interference structure 143, can be shifted by changing the voltage on the first gate. In this example embodiment of the present disclosure, a further gate 154 is positioned next to the further interference structure 153 such that the further local mini-band structure 220, induced by the further interference structure 153, can be shifted by changing the voltage on the further gate 154.

In a second aspect embodiments of the present disclosure relate to a transistor comprising a semiconductor device 100 in accordance with embodiments of the present disclosure. In such a transistor the first electrode 110 is a source and the second electrode 120 is a drain. Such a transistor may comprise one, two, or more interference structures.

In embodiments of the present disclosure the transistor comprises two interference structures. A first interference structure 143 induces a first local mini-band 210 and a further interference structure 153 induces a second local mini-band 220. The first local mini-band 210 may be controlled by a voltage on a first gate 144 and/or the further local mini-band 220 may be controlled by a voltage on a further gate 154.

Figure 4A:
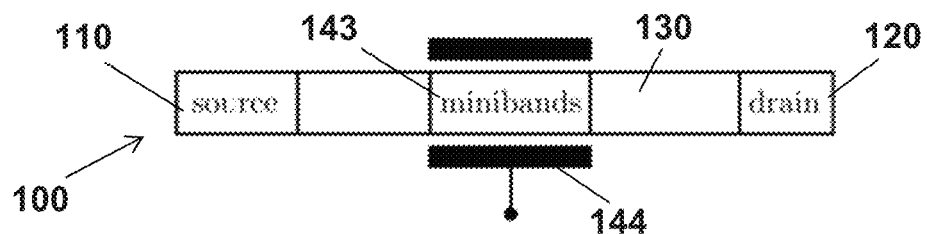
FIG. 4A shows a schematic drawing of a transistor comprising a first interference structure, according to example embodiments.
Figure 4B:
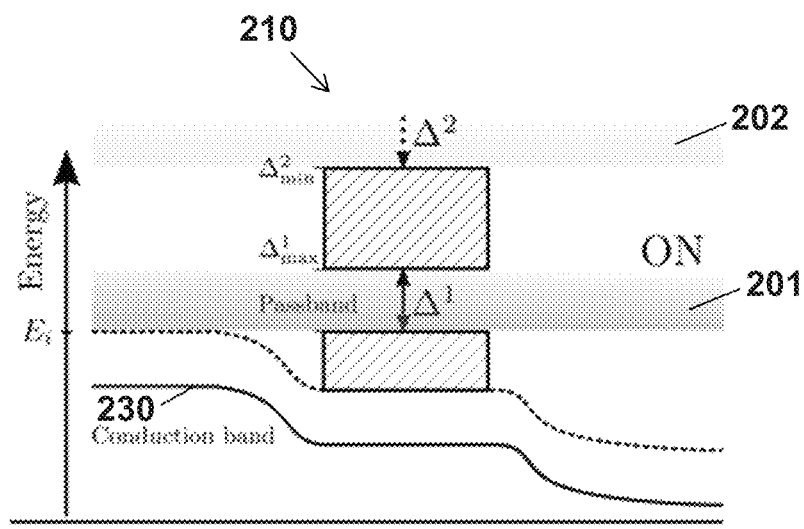
FIG. 4B shows the band structure of the transistor of FIG. 4A for an example voltage at the first gate, according to example embodiments.
Figure 4C:
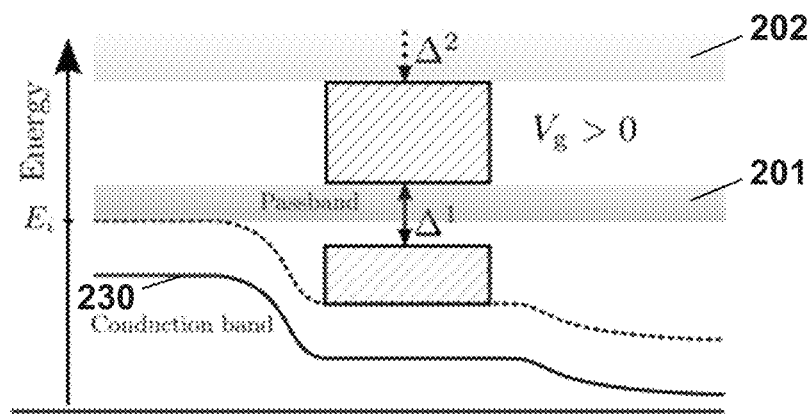
FIG. 4C shows the band structure of the transistor of FIG. 4A for an example voltage at the first gate, according to example embodiments.
Figure 4D:
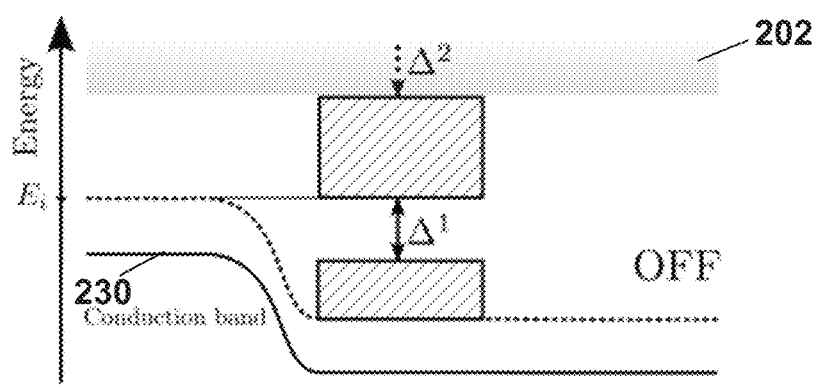
FIG. 4D shows the band structure of the transistor of FIG. 4A for an example voltage at the first gate, according to example embodiments.

FIG. 4A is a schematic drawing of a transistor 100 comprising a first interference structure 143 in accordance with embodiments of the present disclosure. The transistor comprises a source 110, a drain 120, and a channel 130 in between the source and the drain. A first gate 144 is present around the interference structure 143. FIGS. 4B-4D show the band structure for different voltages at the first gate.

Figure 7:
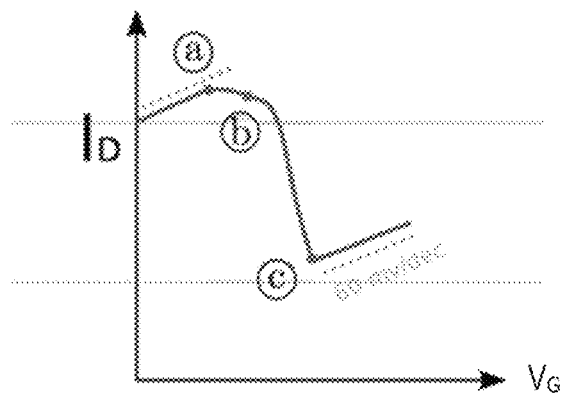
FIG. 7 shows the IV-curve corresponding with the band structures in FIGS. 4B-4D, according to example embodiments.

FIG. 7 shows the IV-curve corresponding with these band structures. By controlling the voltage on the first gate 144 the transistor 100 is switched on or off. In this example the transistor is switched off by applying a positive voltage on the first gate. FIGS. 4B-4D show the first mini-band structure 210 induced by the first interference structure 143. The current carrying states which are carrying the most current (the ones at the bottom of the passband 201) are filtered as last when increasing the voltage on the first gate 144. The current carrying states are filtered by misaligning the mini-band structure 210 and the conduction band 230. In some embodiments of the present disclosure, this results in a steeper slope of the IV-current than in cases where the current carrying states which are carrying the most current would be filtered first. FIGS. 4B-4D show three graphs with band structures for different voltages at the first gate 144. The applied gate voltage is smaller for the first graph (FIG. 4B) than for the second graph (FIG. 4C) and the third graph (FIG. 4D). By increasing the voltage of the first gate also the energy level of the second passband 202 decreases. Thereby the leakage current might increase.

Figure 5A:
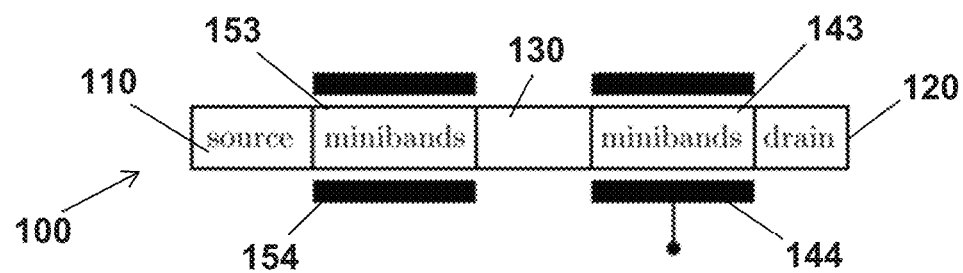
FIG. 5A shows a schematic drawing of a transistor comprising a first and a further interference structure, with the further interference structure closest to the source, according to example embodiments.

FIG. 5A is a schematic drawing of a transistor 100 comprising a first interference structure 143 and a further interference structure 153 in accordance with embodiments of the present disclosure. The transistor comprises a source 110, a drain 120, and a channel 130 in between the source and the drain. A first gate 144 is present around the interference structure 143 and a further gate 154 is present around the further interference structure 153. The first and the further interference structure are arranged in the channel with the first interference structure closest to the source 100.

Figure 5B:
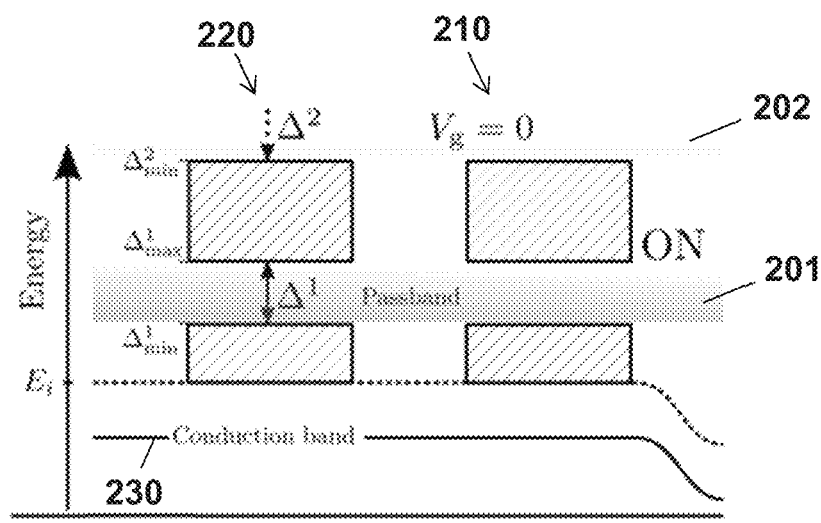
FIG. 5B shows the band structure of the transistor of FIG. 5A for an example voltage at the first gate, according to example embodiments.
Figure 5C:
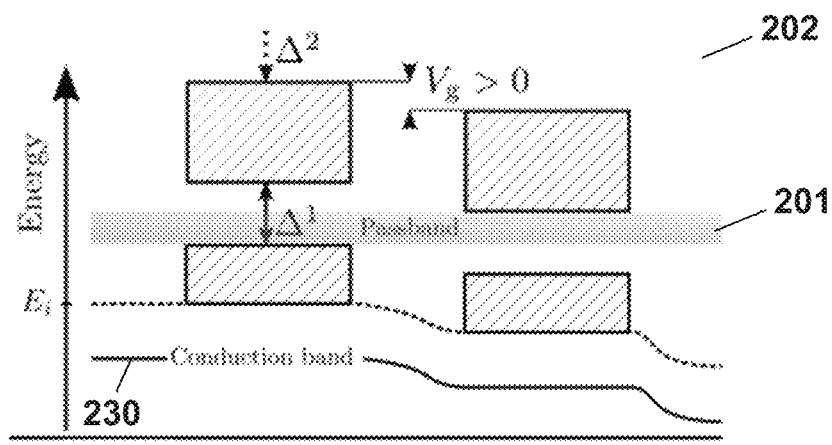
FIG. 5C shows the band structure of the transistor of FIG. 5A for an example voltage at the first gate, according to example embodiments.
Figure 5D:
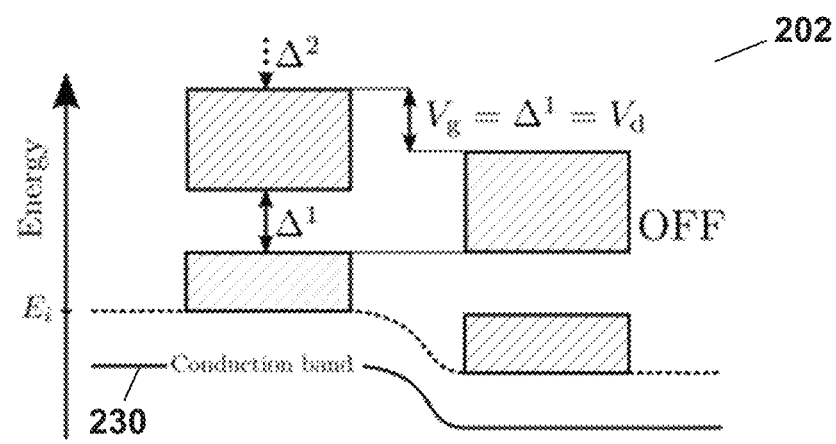
FIG. 5D shows the band structure of the transistor of FIG. 5A for an example voltage at the first gate, according to example embodiments.

In this example the voltage of the first gate 144 is controlled for switching the transistor on or off. FIGS. 5B-5D show the band structure for different voltages at the first gate. The two lowest mini-bands (with bandwidths $\Delta^1$ and $\Delta^2$) for a sub-band i (with confinement energy Ei) are shown. Where the mini-band structures of both interference structures (e.g. super-lattice regions) align, passbands are formed and current can pass. Complete alignment, corresponding to the maximal current case, is pictured in FIG. 5B. When the potential in the first interference structure (143) increases, the passbands become more narrow, resulting in a decrease of the current as shown in FIG. 5C. As soon as misalignment of the lowest mini-bands is complete, the lowest passband ceases to exist and the current drops sharply FIG. 5D. Because the tail of the Fermi-Dirac distribution is blocked from the current carrying states at the top of the passband, states carrying the most current are filtered abruptly, and a turn-off slope steeper than 60 mV per decade can be realized. The remaining off-current arises from the second mini-bands ($\Delta^2$) in both interference structures, that are still partly aligned, and result in a second passband 202. Their contribution, however, can be minimized by ensuring that $\Delta_{min}^2$ occurs at a sufficiently high energy, where the occupation probability is negligible.

In embodiments of the present disclosure the first and further mini-band structure are such that the second mini-band gap, $\Delta_{min}^2-\Delta_{min}^1$ is wider than the lowest mini-band ($\Delta^1$), formed by the alignment of the lowest mini-bands. Thus, some embodiments of the present disclosure allow for a complete misalignment.

In this example embodiment of the present disclosure, the minimal drain bias equals $\Delta^1$, the gate bias of the first gate 144 varying from 0 V to this drain bias.

Figure 8:
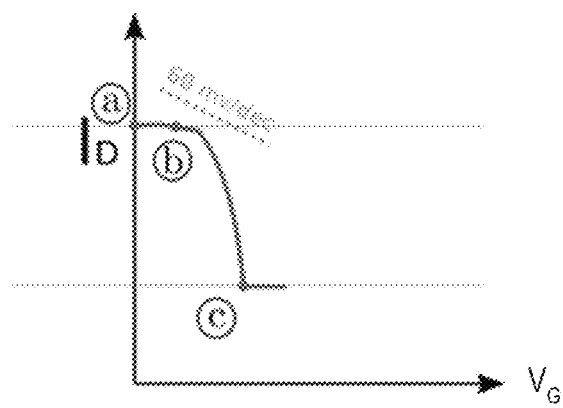
FIG. 8 shows the IV-curve corresponding with the band structures in FIGS. 5B-5D, according to example embodiments.

FIG. 8 shows the IV-curve corresponding with these band structures.

In this example the transistor is switched off by applying a positive voltage on the first gate. FIGS. 5B-5D show the first local mini-band structure 210 induced by the first interference structure 143 and the further local mini-band structure 220 induced by the further interference structure 153.

In this example the current carrying states which are carrying the most current (the ones at the bottom of the passband 201) are filtered as last. FIGS. 5B-5D show three graphs with band structures for different voltages at the first gate. The applied gate voltage is smaller for the first graph (FIG. 5B) than for the second graph (FIG. 5C) and the third graph (FIG. 5D). In this example the energy level of the second passband 202 does not decrease with an increasing gate voltage of the first gate. This is because of the two interference structures 143, 153 in the channel which induce two local mini-band structures 210, 220. Thus, some embodiments of the present disclosure allow the leakage current to be decreased compared to an embodiment with only one mini-band structure.

Figure 6A:
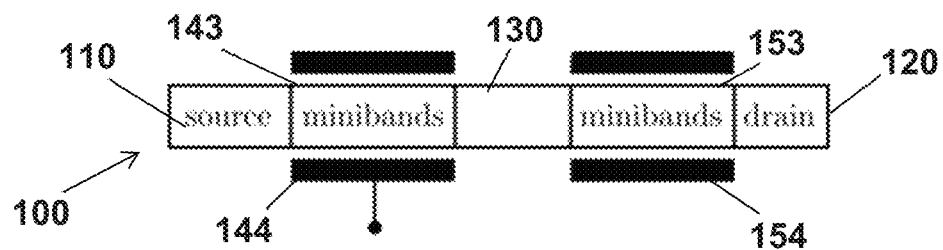
FIG. 6A shows a schematic drawing of a transistor comprising a first and a further interference structure, with the first interference structure closest to the source, according to example embodiments.
Figure 6B:
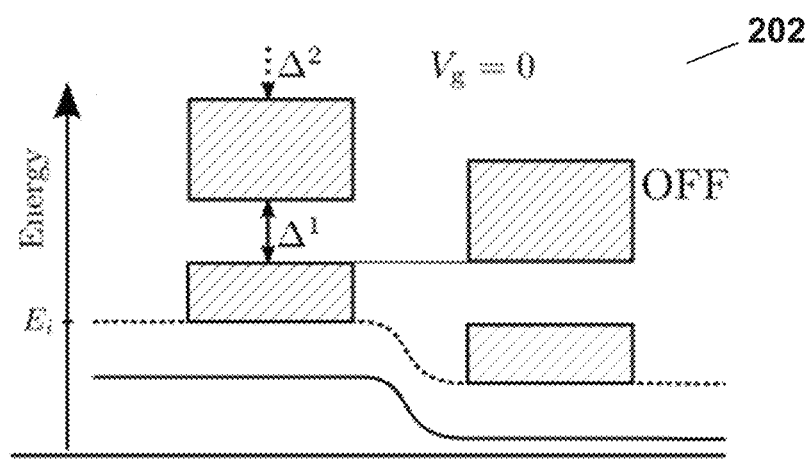
FIG. 6B shows the band structure of the transistor of FIG. 6A for an example voltage at the first gate, according to example embodiments.
Figure 6C:
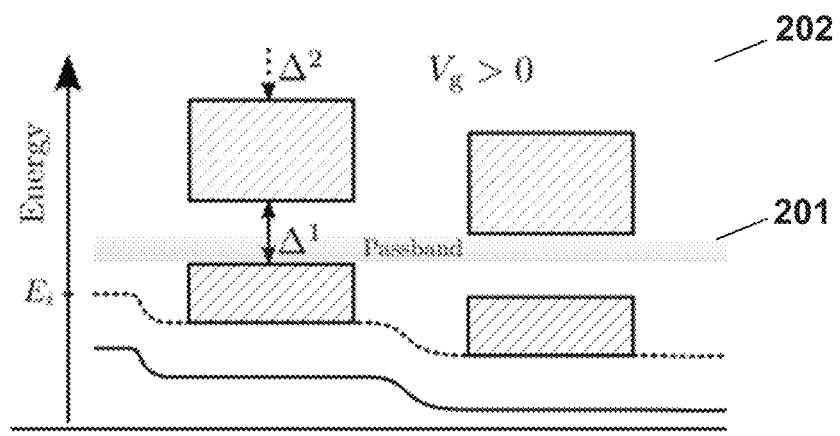
FIG. 6C shows the band structure of the transistor of FIG. 6A for an example voltage at the first gate, according to example embodiments.
Figure 6D:
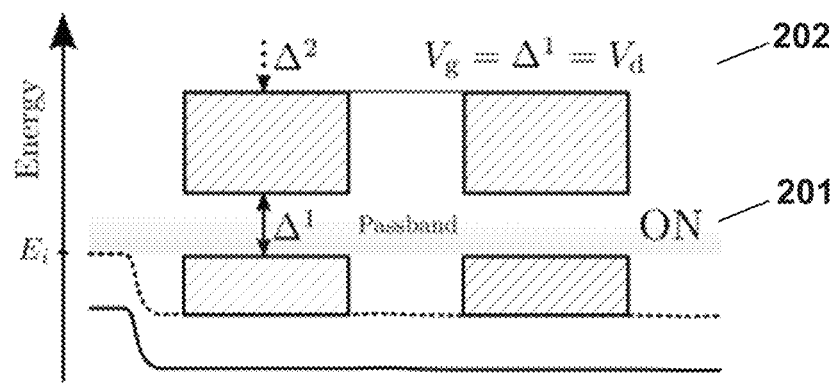
FIG. 6D shows the band structure of the transistor of FIG. 6A for an example voltage at the first gate, according to example embodiments.
Figure 9:
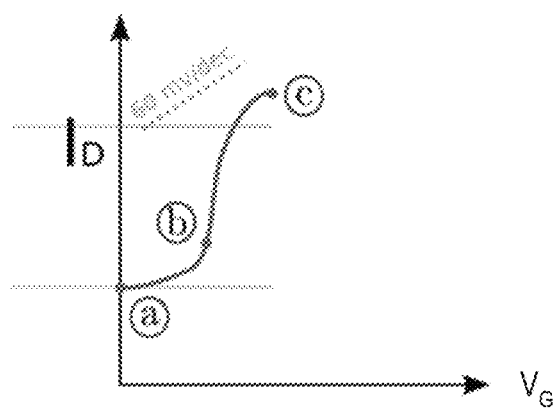
FIG. 9 shows the IV-curve corresponding with the band structures in FIGS. 6B-6D, according to example embodiments.

FIGS. 6A-6D are similar to FIGS. 5A-5D, with this difference that in FIG. 6A the first interference structure 143 and the first gate 144 are closer to the source than the further interference structure 153 and the further gate 154. The voltage of the first gate is controlled for switching the transistor on or off. In some embodiments of the present disclosure, the same structure (the transistor illustrated in FIG. 5A compared to the transistor illustrated in FIG. 6A) can be used for p-type as well as n-type FETs. Only the gate which is controlled to shift is closer to the drain for the structure illustrated in FIG. 6A. Thus, in some embodiments, only one type of doping may be used. FIG. 9 shows the IV-curve corresponding with the band structures shown in FIGS. 6B-6D.

Figure 2:
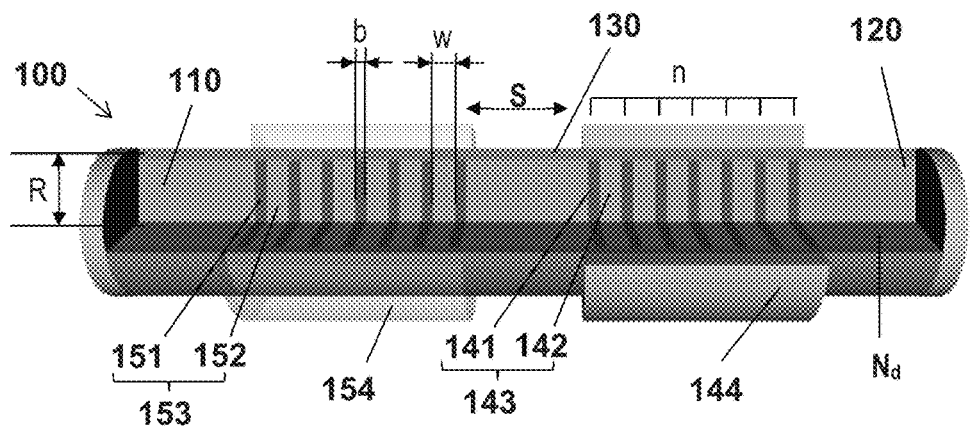
FIG. 2 shows a schematic drawing of a semiconductor device comprising super-lattices, according to example embodiments.

Semiconductor device comprising two interference structures 143, 153, in accordance with embodiments of the present disclosure, could be implemented as schematically illustrated in FIG. 2. In this example a pair of super-lattices 143, 153 is incorporated in a channel (in this case a nanowire) 130. Both super-lattices 143, 153 are surrounded by a gate 144, 154. This semiconductor device may be used by biasing the first gate 144 for switching the semiconductor device on or off. The second gate 154 may for example only be serving the purpose of electrostatic doping as an alternative to impurity doping. Consequently, in this example embodiment of the present disclosure, the super-lattices 143, 153 and the region in between them are undoped. In the example embodiment of the present disclosure illustrated in FIG. 2, the super-lattice structures comprise barriers 141, 151 and wells 142, 152. In this example embodiment of the present disclosure, the material pair is lattice matched GaAs/AlGaAs, which has a conduction band offset of 0.5 eV and an effective mass of 0.063 $m_e$. The number (n) of barriers 141, 151 of the super-lattices 143, 153, the radius R of the nanowire 130, the barrier and the well widths (b and w), and the doping $N_d$ of the source 110 and the drain 120 and the spacing S between two super-lattices 143, 153 are different design parameters. The barrier and well width b and w are chosen to be 1.5 nm and 4.0 nm, respectively, leading to $\Delta_1 \approx 0.11$ eV. The drain voltage in this example may for example be set to 0.15 V. This is slightly larger than $\Delta 1$.

The minimum value of the barrier width b and the well width w may be determined by 1 or a few atomic layers. The maximum limit may be determined by the fact that too high barriers/too narrow wells, will result in a very specific resonant energy level rather than energy bands. Specific numbers for the barrier width and the well width depend on, amongst others, the dimensions of the super-lattice, the choice of material. The barrier width b and the well width w may for example not be larger than 5 nm.

In this example embodiment of the present disclosure n=8, R=5 nm, and $N_d$ is chosen such that the Fermi level in the source 110 coincides with $\Delta_{min}^1$ of the lowest sub-band. The semiconductor device may comprise an $Al_2O_3$ oxide of 1 nm (dielectric constant $\varepsilon \approx 10$, electron effective mass $m^*_e \approx 0.4\ m_e$, energy barrier with respect to GaAs $\approx 3.0$ eV).

The minimum value of the spacing S between the two super-lattices 143, 153 may be determined by unwanted coupling between the two gates, if they are too close together. The minimum value of the spacing may also be determined by what is possible with process technology. The maximum limit of the spacing S may be determined by the fact that electrons are more likely to lose their coherence in between the two gates if the spacing is above this maximum limit. In embodiments of the present disclosure the working principle is based on this coherence. In embodiments of the present disclosure S may be around 10 nm. Smaller values of S may be preferred, in some embodiments. It may for example be below 15 nm, or even below 12 nm, or even below 10 nm, or even below 8 nm.

In the following, only the conduction band is taken into account in view of the high doping concentration in source and drain. The energy eigenfunctions of the device are obtained by solving the time-independent Schrödinger equation with quantum transmitting boundary conditions. Deriving the charge density from these states, Poisson's equation yields an additional potential and the process is repeated until a self-consistent potential is obtained. All partial differential equations (2D, because of the axial symmetry) may be solved using the finite element software. As to the steady-state occupation of the states, ballistic transport is adopted assuming that a state is occupied according to the Fermi-Dirac distribution of the lead it originates from. This leads to the following expression for the current:

$$I = \frac{e}{\pi \hbar} \sum_i \int_{E_i}^{\infty} T_i(\varepsilon)[f(\varepsilon, \mu_s) - f(\varepsilon, \mu_d)]d\varepsilon \quad (1)$$

where $T(\varepsilon)$ is the transmission coefficient written as function of electron energy, f is the Fermi-Dirac distribution and $\mu_s$ and $\mu_d$ respectively denote the Fermi-level in source and drain.

The summation runs over all sub-bands that are present due to radial confinement.

Figure 10:
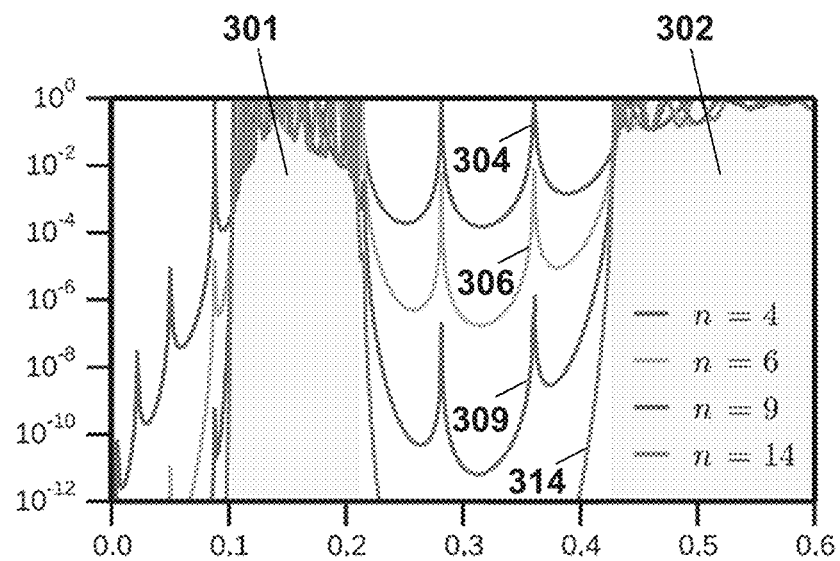
FIG. 10 shows the transmission spectrum of the unbiased device for a varying amount of super-lattice barriers n, according to example embodiments.

FIG. 10 shows the transmission spectrum of the unbiased device for a varying amount of super-lattice barriers n. The horizontal axis shows the energy in eV. The mini-bands 301, 302 of the Kronig-Penney model for the same values b and w are shaded in grey.

Figure 11:
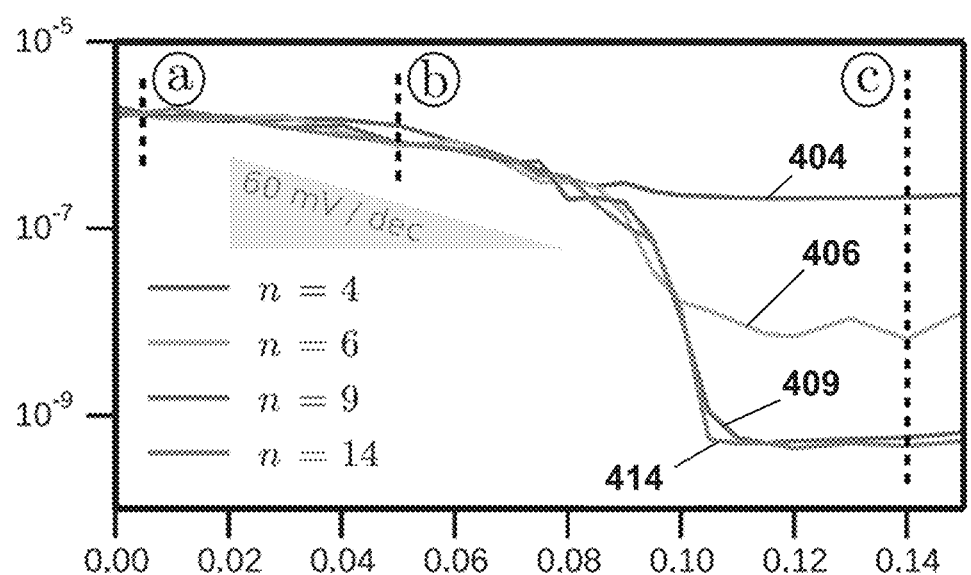
FIG. 11 shows the IV characteristics corresponding with the transmission spectra of FIG. 10, according to example embodiments.

FIG. 11 shows the corresponding IV characteristics. On the x-axis the gate voltage (in V) applied to the first gate 154 is shown. On the y-axis the current through the semiconductor device is shown (in A). For three different cases a, b and c, the idealized mini-band structures are plotted in FIGS. 5B-5D. For two different cases b and c, the simulated mini-band structures are plotted FIGS. 12A and 12B.

In FIG. 10 and FIG. 11, n is the number of barriers in the interference structures 143, 153. In FIG. 10, curve 304 corresponds with n=4, curve 306 with n=6, curve 309 with n=9, and curve 314 with n=14. In FIG. 11, curve 404 corresponds with n=4, curve 406 with n=6, curve 409 with n=9, and curve 414 with n=14. For increasing n, the transmission mini-bands converge to those of an infinite super-lattice, as appearing in the Kronig-Penney model: single transmission peaks that correspond to resonance between—rather than within—the super-lattices disappear and transmission in the mini-band gaps drops to insignificant low values. For super-lattices containing only 3 or 4 barriers, on the contrary, transmission in the mini-band gap is too significant for a steep subthreshold slope to emerge. Inclusion of more barriers was found to result in more clearly defined mini-bands and a sharper current drop, exceeding one decade over 10 mV, as predicted by the simulations.

Figure 12A:
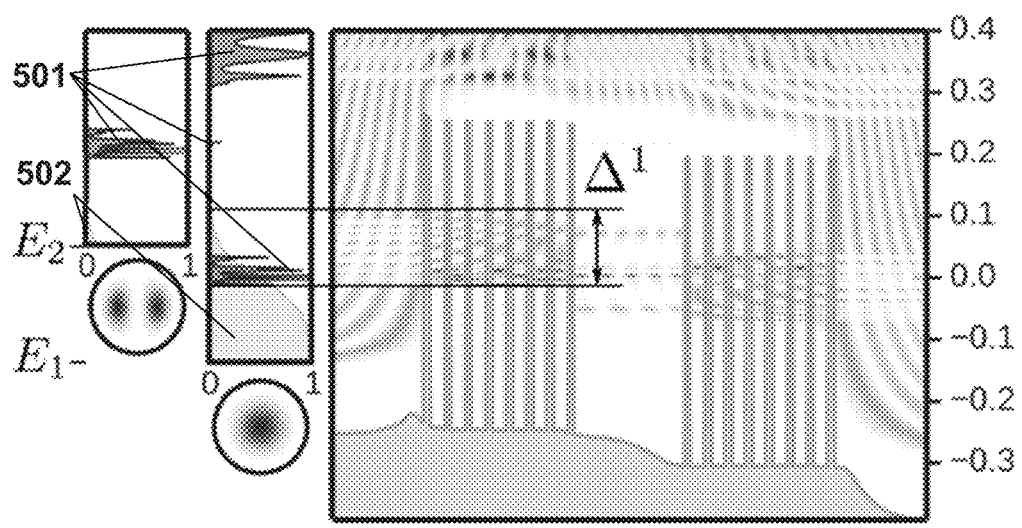
FIG. 12A shows the simulated mini-band structures for one gate bias, according to example embodiments.
Figure 12B:
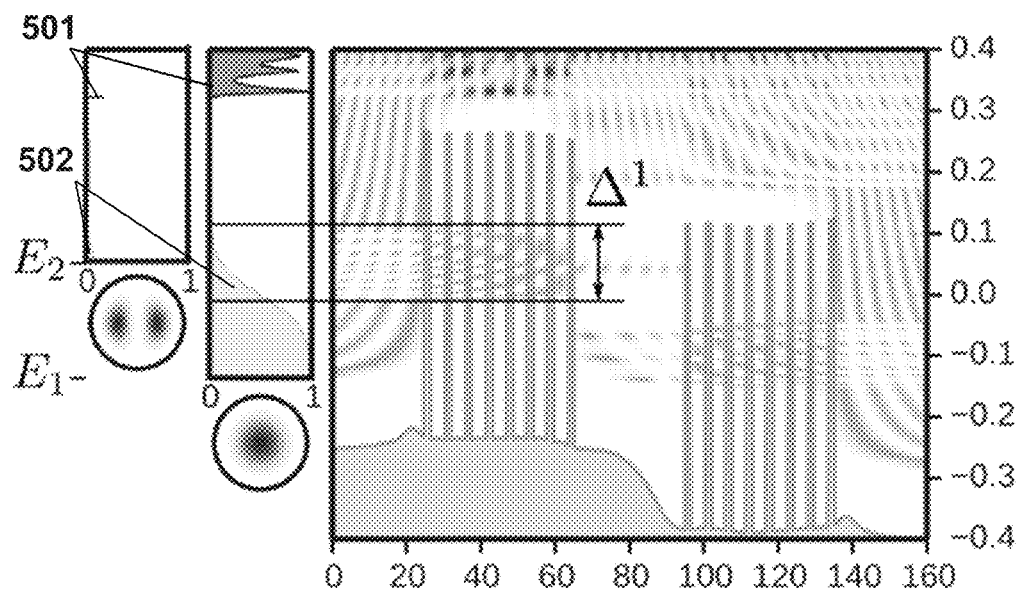
FIG. 12B shows the simulated mini-band structures for one gate bias, according to example embodiments.

From FIG. 11, it can be seen that beyond 9 barriers, however, further improvement of the subthreshold slope is marginal. It is worth noticing that increasing the applied gate bias beyond $\Delta^1 \approx 0.11$ eV has little effect, as the mini-bands cannot be more misaligned as they already are. For specific gate biases of 0.05 V (case b) and 0.14 V (case c), FIGS. 12A and 12B show the simulated mini-band structure. The y-axis of the graph shows the energy (in eV). The x-axis shows the position along the axis (in nm). The transmission spectrum and occupation probability for the lowest two sub-bands in the source, and the sub-band's electron density in a cross-section of the lead, are shown. For the lowest one, the local density of states $|\Psi(x; E)|^2$ is also shown together with the conduction band minimum.

According to Eq. 1 the ballistic current is determined by the overlap of the transmission spectrum and occupation probability. Plots 501 correspond with transmission and plots 502 correspond with occupation. From FIG. 12A, it is clear that the lowest sub-band dominates the on-current, whereas in FIG. 12B the remaining current originates from the second mini-band. As explained earlier, the low occupation probability of these states ensures that the corresponding off-current is small. Whether resonance occurs or not depends on the electron wave vector perpendicular to the super-lattice planes. Consequently, the transmission spectra for all sub-bands are similar, differing only by an offset due to a different confinement energy. The right side of FIGS. 12A and 12B should be compared with the idealized scheme in FIGS. 5A-5D. Inside the super-lattice regions, the local mini-bands and mini-band gaps can be clearly identified. An overlap of mini-bands results in a passband with nonzero transmission.

Figure 13:
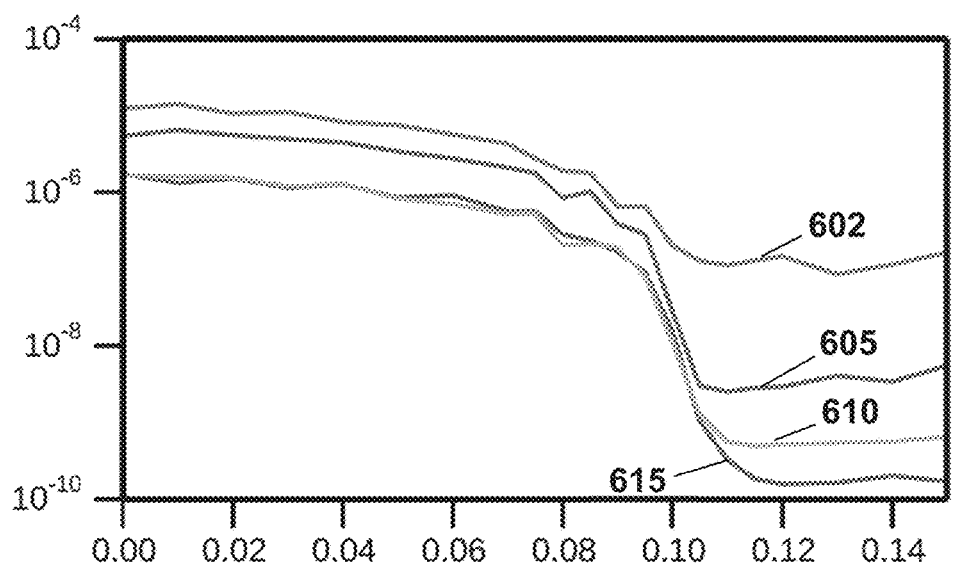
FIG. 13 shows the IV-characteristics of a semiconductor device having different nanowire diameters, according to example embodiments.

FIG. 13 shows the IV-characteristics of a semiconductor device 100 as illustrated in FIG. 2. Different curves are shown for nanowires with different diameters. Curve 602 corresponds with a nanowire of 2 nm, curve 605 with 5 nm, curve 610 with 10 nm, and curve 615 with 15 nm. The x-axis shows the voltage (in V) applied to the first gate 144. The Y-axis shows the current (in A). If the diameter R of the nanowire is small enough, the potential varies only notably in the transport direction, ensuring that the transmission spectra for all sub-bands are similar. For increasing wire radii R, weaker energy quantization causes more sub-bands coming into play, and the current is seen to increase (see FIG. 13). Moreover, when R is taken to be larger, the influence of the gate is most pronounced near the surface, and the potential variation in the radial direction is no longer negligible. As a result, lower sub-bands with a higher electron density near the symmetry axis of the wire will experience a different conduction band offset in the super-lattice. Transmission spectra will vary between sub-bands and misalignment no longer occurs at the same gate bias, if at all. Hence, it becomes more difficult to turn off the device, although sub-60 mV per decade slopes are still possible for wire radii up to 10 nm, as shown in FIG. 13.

Figure 14:
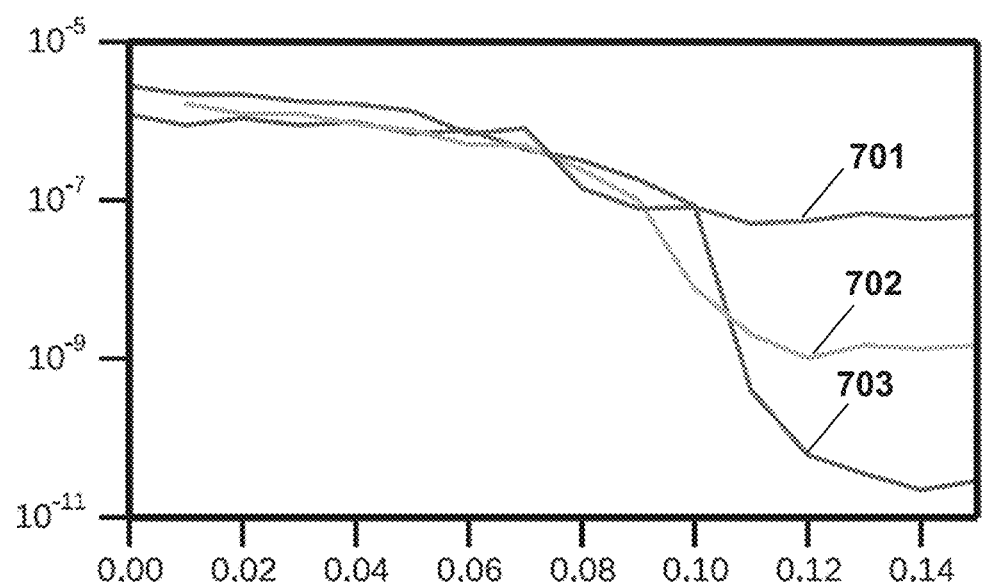
FIG. 14 shows the IV-characteristics of a semiconductor device having different doping levels of the source and the drain leads, according to example embodiments.

FIG. 14 shows the IV-characteristics of a semiconductor device as illustrated in FIG. 2. Different curves are shown for nanowires with different doping levels of the source and drain leads. Curve 701 corresponds with a doping level of 1e19 cm$^{-3}$, curve 702 with a doping level of 4e18 cm$^{-3}$, and curve 703 a doping level of 1e18 cm$^{-3}$. The x-axis shows the voltage (in V) applied to the first gate 144. The Y-axis shows the current (in A). The lead doping together with the wire radius determines the position of the Fermi-level with respect to the mini-bands. FIG. 14 shows that, as expected, the current increases with increasing doping levels. But the current contribution of the second mini-band $\Delta^2$ also becomes larger and, as mentioned earlier, these mini-bands do not misalign and set a lower limit for the off-current. This leads to a trade-off between high doping levels to achieve a substantial on-current, and low occupation of the higher mini-bands to prevent the device from turning off properly. In practice, results are obtained when the Fermi-level of the source lies within the lowest mini-band. The doping level may depend on both the radius, R; the barrier width, b; and the well width, w. Varying the doping within the super-lattices or in the region between them was found to have little influence, because—at least for the diameters considered here—the electrostatic potential is dominated by the gate around it. The situation is different when the gate around the second super-lattice is removed. In that case the self-consistent potential for which the semiconductor device still operates is strongly depend on the doping level in this second super-lattice.

Figure 3:
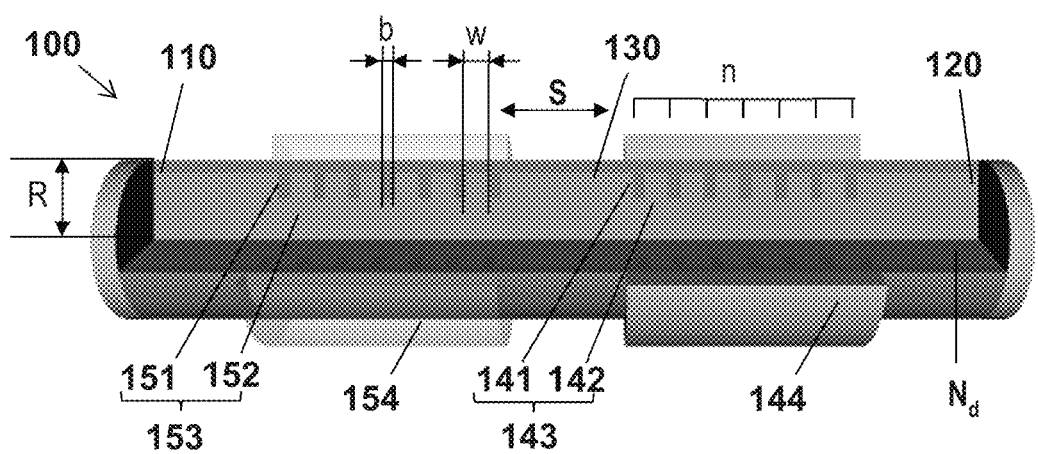
FIG. 3 shows a schematic drawing of a semiconductor device comprising interference structures with a locally varying diameter, according to example embodiments.

FIG. 3 shows a similar semiconductor device as FIG. 2. However, in this device the interference structures 153, 143 are made by locally varying a diameter of the elongated structure. In this example this is done by implementing narrowing barrier regions 141, 151 between the well regions 142, 152.

In a third aspect embodiments of the present disclosure relate to a semiconductor circuit comprising a plurality of semiconductor devices in accordance with embodiments of the present disclosure.

In a fourth aspect embodiments of the present disclosure relate to a method for controlling a semiconductor device 100 in accordance with embodiments of the present disclosure. The method comprises controlling the voltage of the first gate 144 thereby shifting the first local mini-band structure 210 such that it is aligned with another band structure in the semiconductor device 100 to switch the semiconductor device on, or misaligned to switch the semiconductor device off.

In a fifth aspect embodiments of the present disclosure relate to the use of a semiconductor device 100 in accordance with embodiments of the present disclosure, wherein the gates are used as logical inputs of the semiconductor device 100.

In embodiments of the present disclosure the semiconductor device 100 may comprise a plurality of gates 144, 145, each for controlling its respective local mini-band 143, 153. Thus a logical gate can be obtained. When all local mini-bands are aligned, current can flow and the gate returns a 1. If a misalignment is realized between the local mini-bands, current cannot flow and the gate returns a 0.

What is claimed is:

1. A semiconductor device comprising:
   a first electrode;
   a second electrode;
   a channel in between the first electrode and the second electrode;
   a first interference structure located in the channel such that, when a current is flowing from the second electrode to the first electrode, the current passes through the first interference structure; and
   a first gate for controlling a voltage over the first interference structure,
   wherein the first interference structure is formed to induce a first local mini-band structure that can be shifted by the voltage controlled by the first gate, such that the first local mini-band structure is:
      aligned with a band structure in the semiconductor device to turn the semiconductor device on; and
      misaligned with the band structure in the semiconductor device to turn the semiconductor device off.

2. The semiconductor device according to claim 1, further comprising:
   at least one further interference structure located in series with the first interference structure, such that, when the current is flowing from the second electrode to the first electrode, the current passes through the at least one further interference structure,
   wherein the at least one further interference structure is formed to induce a further local mini-band structure, and
   wherein the first local mini-band structure can be shifted by the voltage controlled by the first gate such that the first local mini-band structure and the further local mini-band structure are:
      aligned to turn on the semiconductor device; and
      misaligned to turn the semiconductor device off.

3. The semiconductor device according to claim 2, further comprising two interference structures.

4. The semiconductor device according to claim 2, further comprising at least one further gate for controlling a voltage over at least one of the at least one further interference structures, wherein the at least one further gate is configured to shift the further local mini-band structure.

5. The semiconductor device according to claim 4, wherein the first gate and the at least one further gate are used as logical inputs to the semiconductor device.

6. The semiconductor device according to claim 2, wherein the at least one further interference structure is doped.

7. The semiconductor device according to claim 1, wherein a doping level of the first electrode is selected such that a Fermi-level of the first electrode and the second electrode lies within or just below a lowest mini-band of the first local mini-band structure induced by the first interference structure.

8. The semiconductor device according to claim 1,
wherein the first interference structure is a super-lattice structure comprising stacks of alternating super-lattice planes, and
wherein the super-lattice planes are oriented such that, when a current is flowing from the first electrode to the second electrode, a direction of the current flowing from the first electrode to the second electrode is substantially orthogonal to the super-lattice planes.

9. The semiconductor device according to claim 1, wherein the semiconductor device is an elongated nanostructure.

10. The semiconductor device according to claim 9, wherein the first interference structure is fabricated by locally varying a diameter of the elongated nanostructure.

11. The semiconductor device according to claim 1, wherein the semiconductor device is a component of a semiconductor circuit.

12. A transistor comprising a semiconductor device, wherein the semiconductor device comprises:
a first electrode;
a second electrode;
a channel in between the first electrode and the second electrode;
a first interference structure located in the channel such that, when a current is flowing from the second electrode to the first electrode, the current passes through the first interference structure; and
a first gate for controlling a voltage over the first interference structure,
wherein the first interference structure is formed to induce a first local mini-band structure that can be shifted by the voltage controlled by the first gate, such that the first local mini-band structure is:
aligned with a band structure in the semiconductor device to turn the semiconductor device on; and
misaligned with the band structure in the semiconductor device to turn the semiconductor device off.

13. The transistor according to claim 12, wherein the semiconductor device further comprises:
at least one further interference structure located in series with the first interference structure, such that, when the current is flowing from the second electrode to the first electrode, the current passes through the at least one further interference structure,
wherein the at least one further interference structure is formed to induce a further local mini-band structure, and
wherein the first local mini-band structure can be shifted by the voltage controlled by the first gate such that the first local mini-band structure and the further local mini-band structure are:
aligned to turn on the semiconductor device; and
misaligned to turn the semiconductor device off.

14. The transistor according to claim 13, wherein the semiconductor device further comprises two interference structures.

15. The transistor according to claim 13,
wherein the semiconductor device further comprises at least one further gate for controlling a voltage over at least one of the at least one further interference structures, and
wherein the at least one further gate is configured to shift the further local mini-band structure.

16. The transistor according to claim 12,
wherein the first electrode is a source, and
wherein the second electrode is a drain.

17. The transistor according to claim 12, wherein the transistor is a component of a semiconductor circuit.

18. A method for controlling a semiconductor device, comprising:
controlling a voltage of a first gate to shift a first local mini-band structure such that:
the first local mini-band structure is aligned with a band structure in the semiconductor device to switch the semiconductor device on; or
the first local mini-band structure is misaligned with the band structure in the semiconductor device to switch the semiconductor device off,
wherein the semiconductor device comprises:
a first electrode;
a second electrode;
a channel in between the first electrode and the second electrode; and
a first interference structure located in the channel such that, when a current is flowing from the second electrode to the first electrode, the current passes through the first interference structure,
wherein the first gate is for controlling a voltage over the first interference structure, and
wherein the first interference structure is formed to induce the first local mini-band structure, which can be shifted by the voltage controlled by the first gate.

19. The method according to claim 18, further comprising:
controlling the voltage of the first gate and a voltage of at least one further gate such that:
the first local mini-band structure and a further local mini-band structure are aligned for switching on the semiconductor device; or
the first local mini-band structure and the further local mini-band structure are misaligned for switching off the semiconductor device,
wherein the semiconductor device further comprises:
at least one further interference structure located in series with the first interference structure, such that, when the current is flowing from the second electrode to the first electrode, the current passes through the at least one further interference structure,
wherein the at least one further interference structure is formed to induce the further local mini-band structure, and
wherein the first local mini-band structure can be shifted by the voltage controlled by the first gate; and the at least one further gate for controlling the voltage over at least one of the at least one further interference structures, wherein the at least one further gate is configured to shift the further local mini-band structure.

20. The method according to claim 18, further comprising:

shifting, by applying a fixed offset voltage on at least one further gate, a further local mini-band structure by a fixed offset, wherein the semiconductor device further comprises:

at least one further interference structure located in series with the first interference structure, such that, when the current is flowing from the second electrode to the first electrode, the current passes through the at least one further interference structure, wherein the at least one further interference structure is formed to induce the further local mini-band structure, and wherein the first local mini-band structure can be shifted by the voltage controlled by the first gate such that the first local mini-band structure and the further local mini-band structure are:
aligned to turn on the semiconductor device; and
misaligned to turn the semiconductor device off; and the at least one further gate for controlling a voltage over at least one of the at least one further interference structures.

\* \* \* \* \*